United States Patent
Jeong et al.

(10) Patent No.: US 9,564,588 B2
(45) Date of Patent: Feb. 7, 2017

(54) DEVICE FOR DETECTING SURFACE PLASMON AND POLARIZATION BY USING TOPOLOGICAL INSULATOR, METHOD OF MANUFACTURING THE DEVICE, AND METHOD OF DETECTING SURFACE PLASMON AND POLARIZATION

(71) Applicant: SAMSUNG ELECTRONICS CO., LTD., Suwon-si (KR)

(72) Inventors: Hee-jeong Jeong, Seoul (KR); Chang-won Lee, Hwaseong-si (KR); Sang-mo Cheon, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 63 days.

(21) Appl. No.: 14/275,209

(22) Filed: May 12, 2014

(65) Prior Publication Data
US 2015/0138553 A1    May 21, 2015

(30) Foreign Application Priority Data
Nov. 19, 2013  (KR) .................. 10-2013-0140894

(51) Int. Cl.
| H01L 49/00 | (2006.01) |
| H01L 31/0232 | (2014.01) |
| H01L 31/18 | (2006.01) |
| H01L 31/032 | (2006.01) |

(52) U.S. Cl.
CPC ....... *H01L 49/006* (2013.01); *H01L 31/02325* (2013.01); *H01L 31/032* (2013.01); *H01L 31/18* (2013.01); *H01L 49/00* (2013.01)

(58) Field of Classification Search
None
See application file for complete search history.

(56) References Cited

U.S. PATENT DOCUMENTS

| 7,697,799 | B2 | 4/2010 | Furuyama |
| 7,960,753 | B2 | 6/2011 | Conway et al. |
| 8,044,483 | B2 | 10/2011 | Furuyama |
| 8,227,793 | B2 | 7/2012 | Ahn |
| 8,344,750 | B2 | 1/2013 | Blumberg |
| 2009/0065801 | A1* | 3/2009 | Conway .......... B82Y 20/00 257/104 |
| 2011/0001124 | A1* | 1/2011 | Ahn ............... H01L 31/112 257/14 |
| 2012/0068049 | A1 | 3/2012 | Ogawa |
| 2013/0026442 | A1 | 1/2013 | Kim |

(Continued)

FOREIGN PATENT DOCUMENTS

KR  10-2013-0015794 A  2/2013

OTHER PUBLICATIONS

McIver, J.W., et al., "Control Over Topological Insulator Photocurrents with Light Polarization," Nature Nanotechnology, vol. 7, Dec. 4, 2011, pp. 96-100.

(Continued)

*Primary Examiner* — Andrew Jordan
(74) *Attorney, Agent, or Firm* — Sughrue Mion, PLLC

(57) ABSTRACT

A device for detecting a surface plasmon and polarization includes: a topological insulating layer formed on a substrate; first and second electrodes formed on the topological insulating layer; and a waveguide connected to the topological insulating layer between the first and second electrodes.

22 Claims, 3 Drawing Sheets

(56) References Cited

U.S. PATENT DOCUMENTS

2015/0138553 A1* 5/2015 Jeong ............... H01L 31/02325
356/369

OTHER PUBLICATIONS

Falk, Abram et al., "Near-field Electrical Detection of Optical Plasmons and Single Plasmon Sources," Nature Publishing Group, 2009, pp. 1-27.
Seo, Jungpil, "Perfect Order Hidden Behind Imperfect Solid States: Topological Insulators," Physics and High Technology, Apr. 2011, pp. 11-17.
Kane, Charles et al., "Topological Insulators," Physics World, Feb. 2011, vol. 24, pp. 32-36.
"Topological Insulators", Jan. 2010, Retrieved from http://hoffman.physics.harvard.edu/materials/Topological.php, last visited Dec. 8, 2015.
Falk, et al.; "Near-Field Electrical Detection of Optical Plasmons and Single-Plasmon Sources", Nature Physics, Jul. 2009, vol. 5, pp. 475-479, 5 pages total.
Tse, et al.; "Giant Magneto-Optical Kerr Effect and Universal Faraday Effect in Thin-Film Topological Insulators", Physical Review Letters, Jul. 2010, vol. 105, 4 pages total.

* cited by examiner

DEVICE FOR DETECTING SURFACE PLASMON AND POLARIZATION BY USING TOPOLOGICAL INSULATOR, METHOD OF MANUFACTURING THE DEVICE, AND METHOD OF DETECTING SURFACE PLASMON AND POLARIZATION

CROSS-REFERENCE TO RELATED APPLICATION

This application claims priority from Korean Patent Application No. 10-2013-0140894, filed on Nov. 19, 2013, in the Korean Intellectual Property Office, the disclosure of which is incorporated herein in its entirety by reference.

BACKGROUND

1. Field

The present disclosure relates to detecting surface plasmon, and more particularly, to detecting surface plasmon and polarization using a topological insulator.

2. Description of the Related Art

Due to the diffraction limit of a wavelength, there is a limit in reducing the size of an optical device. In order to overcome this problem, a surface plasmon polariton (SPP) is used. An energy transmitted in the SSP type can be re-extracted in light type. Accordingly, an energy transmitted in the SSP type can be optically detected. However, when the energy transmitted in the SSP type is electrically detected, device applicability may be widened.

A method of electrically detecting a short wave SSP by using a germanium (Ge) nano-line channel has been disclosed as a method of electrically detecting the SSP. Also, a method of using graphene channel has been disclosed as a further developed method.

When graphene having a high mobility ($\leq 200,000$ cm$^2$ V$^{-1}$ s$^{-1}$) compared to a related art semiconductor (for example, a nanowire) and an SSP are combined, an integrated optical device of a super high speed and a wideband may be realized.

SUMMARY

According to one or more exemplary embodiments, there are provided devices for detecting surface plasmon and polarization.

According to one or more exemplary embodiments, there are provided methods of manufacturing the device.

According to one or more exemplary embodiments, there are provided methods of detecting surface plasmon and polarization using the device.

According to an aspect of an exemplary embodiment, a device for detecting a surface plasmon and polarization includes: a topological insulating layer formed on a substrate; first and second electrodes formed on the topological insulating layer; and a waveguide connected to the topological insulating layer between the first and second electrodes.

The topological insulating layer may be a channel layer, and may be a bismuth selenide ($Bi_2Se_3$) layer or a bismuth telluride ($Bi_2Te_3$) layer.

The waveguide may be an SPP waveguide.

The waveguide may include a plurality of waveguides separated from each other.

The waveguide may have a portion extending from the topological insulating layer.

The cross-section of the waveguide may have one of a circular shape, a non-circular shape, a rectangular shape, and a trapezoidal shape.

The plural waveguides may have different sizes.

According to an aspect of an exemplary embodiment, a method of manufacturing a device for detecting a surface plasmon and polarization, includes: forming a topological insulating layer on a substrate; and forming first and second electrodes and a waveguide that are separated from each other on the topological insulating layer.

The forming of the first and second electrodes and the waveguide may include simultaneously forming the first and second electrodes and the waveguide.

The forming of the first and second electrodes and the waveguide may include forming the first and second electrodes before or after forming the waveguide.

The forming of the waveguide may include forming a portion of the waveguide separately from the topological insulating layer.

The forming of the waveguide may include forming a plurality of waveguides separated from each other on the topological insulating layer.

The waveguides may have different sizes from each other.

According to an aspect of an exemplary embodiment, a method of detecting a surface plasmon and polarization using the device described above, the method includes: generating carriers in the topological insulating layer; and measuring the generated carriers.

The generating of carriers in the topological insulating layer may include irradiating light to the waveguide.

The method may further include determining a flow direction of the generated carriers.

The generating of carriers in the topological insulating layer may include irradiating circularly polarized light to the waveguide.

The light may have a wavelength of 1 mm or less, and may have one of a continuous wave type laser, a Gaussian type wave, a square type wave, and an arbitrary type wave.

BRIEF DESCRIPTION OF THE DRAWINGS

The above and/or other aspects will be more apparent by describing certain exemplary embodiments, with reference to the accompanying drawings, in which.

DETAILED DESCRIPTION

Figure 1:
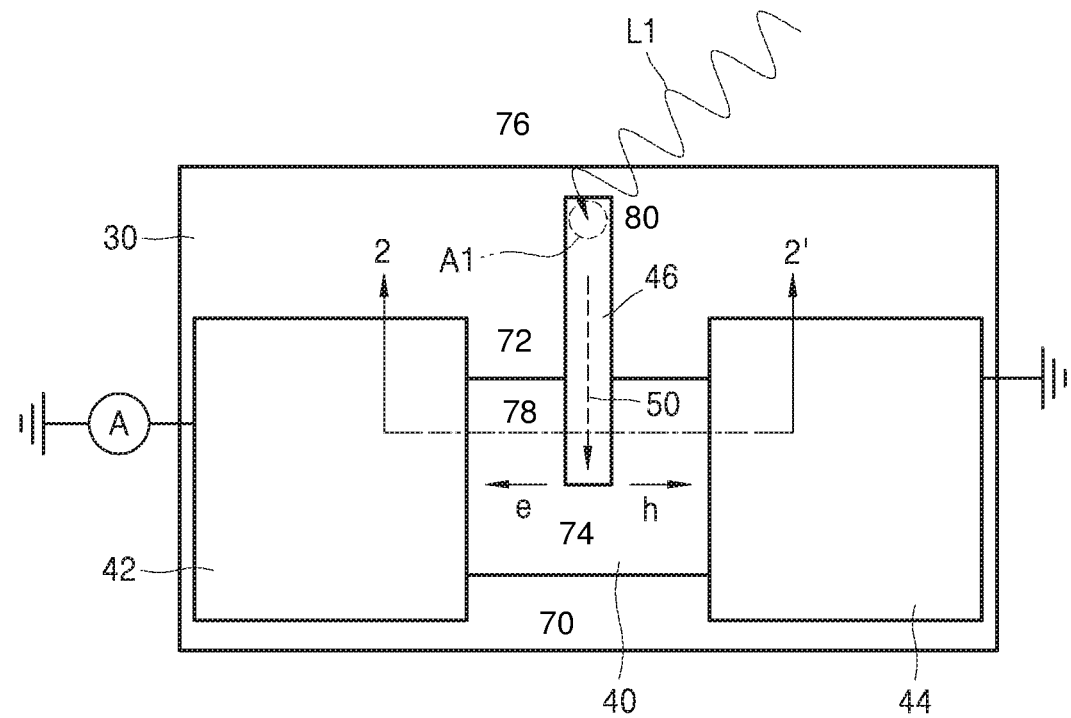
FIG. 1 is a plan view of a device for detecting a surface plasmon polariton (SPP) and polarization according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

A device for detecting surface plasmon and polarization, a method of manufacturing the device, and a method of detecting a surface plasmon polariton (SPP) and polarization according to an exemplary embodiment will be described. In the drawings, the thicknesses of layers and regions may be exaggerated for clarity.

The device for electrically detecting surface plasmon and polarization state of light according to an exemplary embodiment will be described with reference to FIGS. 1 and 2.

The process of detecting surface plasmon or SSP and polarization state of light will be described with the description of the device.

Referring to FIG. 1, first and second electrodes 42 and 44 that are separated from each other are formed on a substrate 30. One of the first and second electrodes 42 and 44 may be an anode electrode (for example, the first electrode 42) and the other may be a cathode electrode. The first and second electrodes 42 and 44 may be formed of, for example, gold (Au). The first and second electrodes 42 and 44 may be formed of a single metal, an alloy, or silicide having a high conductivity, and may be formed of various conductive materials that may be used as electrodes. A topological insulating layer 40 that is a topological insulator is formed between the first and second electrodes 42 and 44 and has a first edge 70 and a second edge 72 spaced apart from one another. The topological insulating layer 40 may be a channel layer. An SPP waveguide 46 is connected to the topological insulating layer 40 and has an elongated body surface of the topological insulating layer 40. The SPP waveguide 46 includes a first portion 78, which is connected to the topological insulating layer 40 between the first and second electrodes 42 and 44, and a second portion 80, which extends front the second edge 72 of the topological insulating layer 40. The first edge 74 of the SPP waveguide 46 is terminated on the topological insulating layer 40 between the first edge 70 and the second edge 72 of the topological insulating layer 40. The second edge 76 of the SPP waveguide 46 is disposed opposing the first edge 74 of the SPP waveguide 46, in a lengthwise direction of the elongated body of the SPP waveguide 46. A second portion 80 of the SPP waveguide 46 extends to be separated from the topological insulating layer 40. The SPP waveguide 46 may be a metal line having surface plasmon. At this point, the metal line may be a nanowire. The SPP waveguide 46 may be formed of a conductive material, such as silver (Ag), Au, or copper (Cu). The topological insulating layer 40 follows the relativistic Dirac equation like graphene. Accordingly, carriers, like graphene, may move at a high mobility in the topological insulating layer 40. Also, the topological insulating layer 40 may generate electron-hole pair by absorbing several wavelengths. Accordingly, the topological insulating layer 40 may detect the SPP, like graphene, in a super high speed and a broadband. An edge state of a surface of the topological insulating layer 40 has a spin-dependence. That is, spin-up electrons and spin-down electrons co-exist on the surface of the topological insulating layer 40, and may move in opposite directions from each other. Therefore, the moving direction of the electrons in the topological insulating layer 40 may vary according to the polarization state of incident light L1 included in SPP 50 that is transmitted to the topological insulating layer 40 through the SPP waveguide 46 that is connected to the topological insulating layer 40. For example, when the incident light L1 that enters to a region A1 of the SPP waveguide 46 that is separated from the topological insulating layer 40 is a left-handed rotatory circular polarization σ−, this information is included in the SPP 50. The SPP 50 including the information is transmitted to the topological insulating layer 40. When the left-handed rotatory circular polarization σ− is transmitted to the topological insulating layer 40, a current flows in a right direction according to the edge state characteristic of the surface of the topological insulating layer 40. On the contrary, when the incident light L1 that enters to a region A1 of the SPP waveguide 46 is a right-handed rotatory circular polarization σ+, a current flows in a left direction in the topological insulating layer 40. The current may be measured by a current meter A connected to the first electrode 42. Accordingly, since the direction of a current that flows in the topological insulating layer 40 is measured after irradiating the incident light L1 to the SPP waveguide 46, a polarization state of the incident light L1, that is, whether the incident light L1 is a left-handed rotatory circular polarization σ− or a right-handed rotatory circular polarization σ+ may be seen.

When the polarization state of the incident light L1 that enters to a region A1 of the SPP waveguide 46 is a line polarization, unlike the circular polarization, the direction of a current in the topological insulating layer 40 is not changed. Light that is transmitted to the topological insulating layer 40 through the SPP waveguide 46 generates electrons e and holes h in the topological insulating layer 40. The generated electrons e and the holes move in opposite directions from each other. The electrons e and holes h are generated in the topological insulating layer 40 as a result of transmitting the SPP 50 to the topological insulating layer 40 through the SPP waveguide 46, and thus, the measurement of the electrons e and holes h, that is, the measurement of a current is the electrical measurement of the SPP 50.

As described above, when the topological insulating layer 40 is used as a channel layer, in addition to electrical measurement of the SPP 50, the measurement may be in a broadband at a super high speed, and even more, polarization information included in the SPP 50 may be seen.

The incident light L1 that enters to a region A1 of the SPP waveguide 46 may be, for example, a line polarization, a circular polarization, or a light that has not a polarization. The light L1 may be, for example, a continuous wave laser. The light L1 may be a pulse light having various types of waves, for example, a Gaussian type wave, a square type wave, or an arbitrary type wave. The light L1 may have a bandwidth of, for example, 600 GHz. The light L1 may be a coherent single photon. The light L1 may have a wavelength of, for example, 1 mm or less, may be ultraviolet ray, visible light, or infrared ray, or may be a light having a terahertz (THz) frequency.

Figure 2:
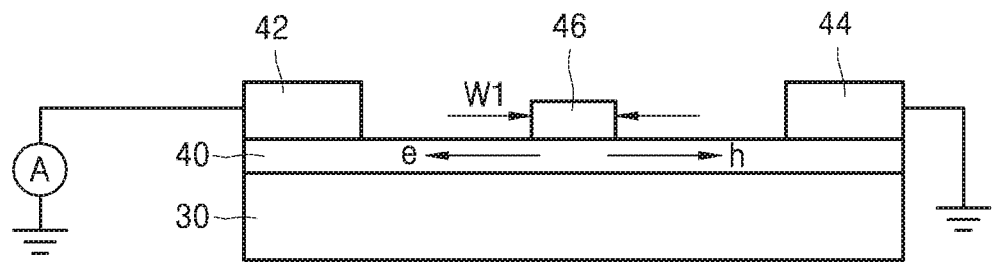
FIG. 2 is a cross-sectional view taken along line 2-2' of the device of FIG. 1.

Referring to FIG. 2 which is a cross-sectional view taken along line 2-2' of the device of FIG. 1, the topological insulating layer 40 is formed on the substrate 30. The first and second electrodes 42 and 44 and the SPP waveguide 46 are formed on the topological insulating layer 40. The SPP waveguide 46 is disposed between the first and second electrodes 42 and 44, and separated from the first and second electrodes 42 and 44. The SPP waveguide 46 may have a diameter W1, for example, in a range from about 1 nm to about 100 μm. In the drawing, the SPP waveguide 46 has a rectangular-shape cross-section. However, the SPP waveguide 46 may have various cross-sectional shapes, for example, a circular shape, a non-circular shape, or a trapezoidal shape. An appropriate wave may be determined according to the cross-sectional shape, a size, or a ratio of the SPP waveguide 46, and thus, a resonance effect of a surface plasmon may be increased.

The size of the device depicted in FIG. 1 may have a size, for example, in a range from about a few nm to about 1 mm.

Figure 3:
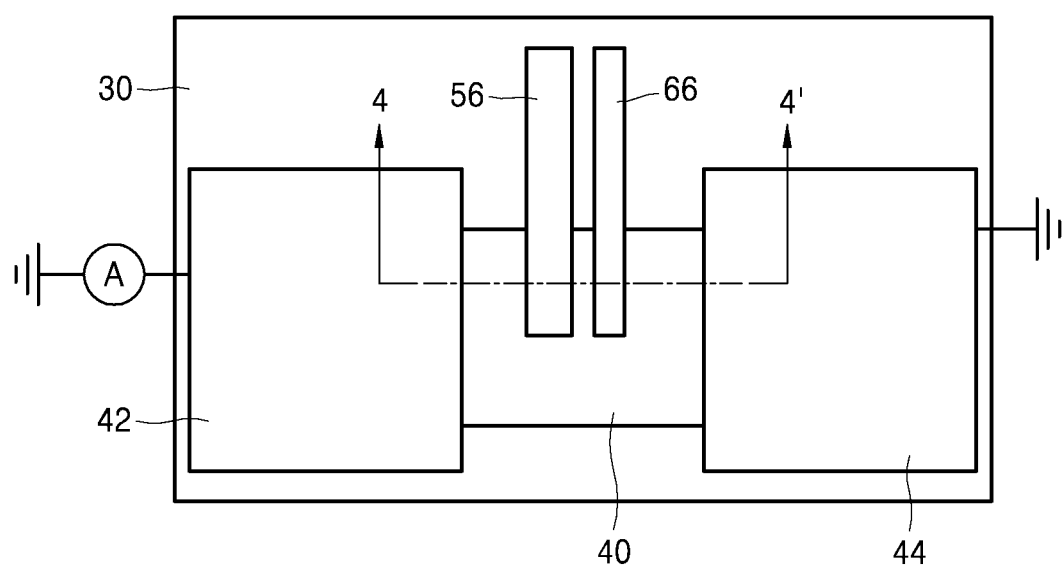
FIG. 3 is a plan view of a device for detecting an SSP and polarization according to an exemplary embodiment.

FIG. 3 is a plan view of a multimode device for electrical detecting an SSP and polarization according to an exemplary embodiment.

Differences from the device of FIG. 1 will be described.

Referring to FIG. 3, first and second waveguides 56 and 66, i.e., waveguide portions, are connected to the topological insulating layer 40. The first and second waveguides 56 and 66 may be SPP waveguides. The first and second waveguides 56 and 66 may have diameters different from each other within a range from about 1 nm to about 100 µm. Lights of different wavelengths may enter to the first and second waveguides 56 and 66, and the first and second waveguides 56 and 66 may transmit different SPPs to the topological insulating layer 40. Since the topological insulating layer 40 has a linear energy-momentum dispersion characteristic, the topological insulating layer 40 generates electrons-holes by absorbing the different SPPs transmitted through the first and second waveguides 56 and 66. As described above, when the topological insulating layer 40 is used, a multimode detection is also possible. A further number of waveguides besides the first and second waveguides 56 and 66 may be connected to the topological insulating layer 40.

Figure 4:
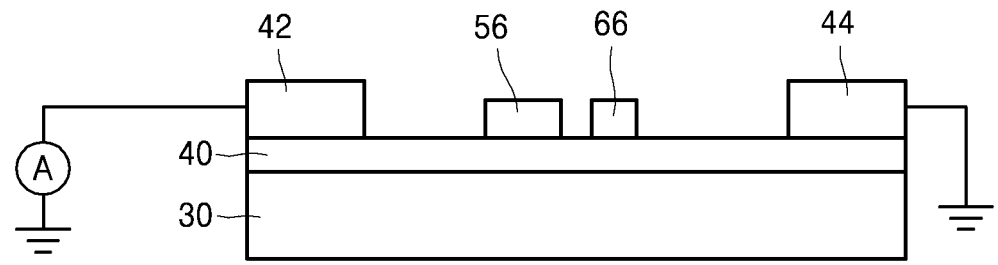
FIG. 4 is a cross-sectional view taken along line 4-4' of the device of FIG. 3.

FIG. 4 is a cross-sectional view taken along line 4-4' of the device of FIG. 3. Differences from the device of FIG. 2 will be mainly described.

Referring to FIG. 4, the first and second waveguides 56 and 66 are disposed between the first and second electrodes 42 and 44 on the topological insulating layer 40. The cross-section of each of the first and second waveguides 56 and 66 may have the same shape as that of the SPP waveguide 46. The cross-sectional shape of the first and second waveguides 56 and 66 may be the same or different.

A method of manufacturing a device for detecting surface plasmon will be described with reference to FIGS. 5 through 7.

Figure 5:
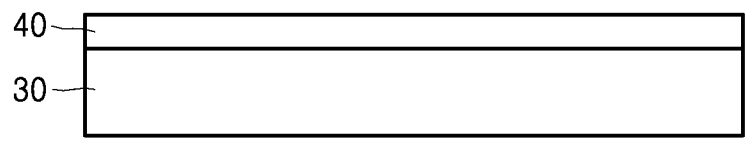
FIGS. 5 and 6 are cross-sectional views of a method of manufacturing a device according to an exemplary embodiment.

Referring to FIG. 5, a topological insulating layer 40 is formed on a substrate 30. The topological insulating layer 40 may be, for example, a $Bi_2Se_3$ layer or a $Bi_2Te_3$ layer, but is not limited thereto.

Figure 6:
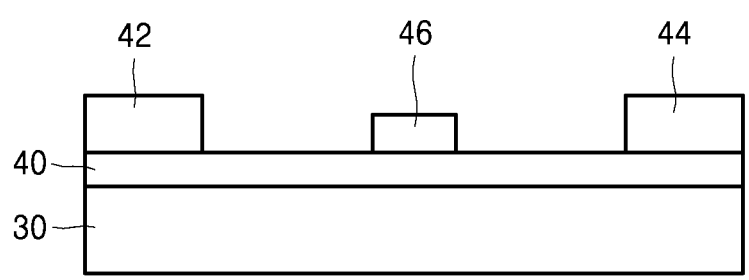

Referring to FIG. 6, first and second electrodes 42 and 44 and an SPP waveguide 46 are formed on the topological insulating layer 40. The first and second electrodes 42 and 44 and the SPP waveguide 46 may be formed at the same time by using the same material. Also, the first and second electrodes 42 and 44 and the SPP waveguide 46 may be formed of different materials, for example, the first and second electrodes 42 and 44 may be formed of a material selected from the group consisting of Au, Ag, and Cu, and the SPP waveguide 46 may be formed of another material from the above group. In this case, the first and second electrodes 42 and 44 are simultaneously formed, but may be formed before or after forming the SPP waveguide 46.

Figure 7:
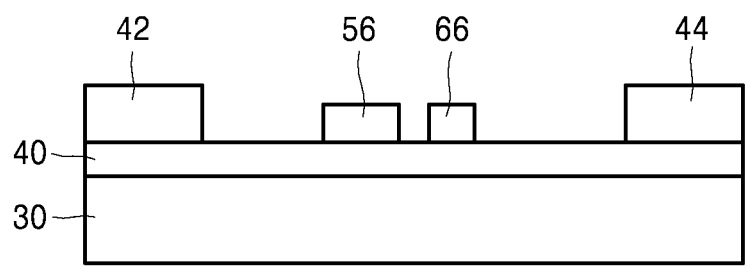
FIG. 7 is a cross-sectional view of a case in which a plurality of waveguides is formed in the method of FIGS. 5 and 6 to realize a multimode.

In the forming of the SPP waveguide 46, as depicted in FIG. 7, first and second waveguides 56 and 66 may be formed on the location where the SPP waveguide 46 is formed. A further number of waveguides may be formed when the first and second waveguides 56 and 66 are formed.

In the method described above, materials that may be used to form the first and second waveguides 56 and 66 and the SPP waveguide 46 are described above when the device is described.

In the device according to the present exemplary embodiment, a topological insulating layer as a channel is provided between electrodes. An SPP transmitted to the topological insulating layer through an SPP waveguide that is connected to the topological insulating layer generates carriers (electrons and holes) in a topological insulator. The generated carriers move to the electrodes and are detected, and thus, the SPP may be electrically detected. The topological insulating layer, like graphene, follows the relativistic Dirac Equation. Accordingly, the detection of carriers in a super speed broad band is possible.

Also, an edge state characteristic of a surface of the topological insulating layer has a spin dependency. Therefore, the direction of current that flows in the topological insulating layer varies according to the polarization state of incident light that is transmitted through the SPP waveguide. Thus, the polarization state of the incident light may be detected by measuring the direction of current that flows in the topological insulating layer.

The foregoing exemplary embodiments and advantages are merely exemplary and are not to be construed as limiting. The present teaching can be readily applied to other types of apparatuses. Descriptions of features or aspects within each embodiment should typically be considered as available for other similar features or aspects in other embodiments. Also, the description of the exemplary embodiments is intended to be illustrative, and not to limit the scope of the claims, and many alternatives, modifications, and variations will be apparent to those skilled in the art.

What is claimed is:

1. A device for detecting a surface plasmon and polarization, the device comprising:
   a topological insulating layer which is formed on a substrate and has a first edge and a second edge;
   first and second electrodes formed on the topological insulating layer; and
   a waveguide, which has an elongated body extending between a first edge and a second edge of the waveguide, the waveguide including:
   a first portion which is connected to the topological insulating layer between the first and second electrodes and includes the first edge of the waveguide that is terminated on the topological insulating layer between the first edge and the second edge of the topological insulating layer, and
   a second portion which extends from the second edge of the topological insulating layer and includes the second edge of the waveguide that is disposed opposing the first edge of the waveguide, in a lengthwise direction of the elongated body of the waveguide.

2. The device of claim 1, wherein the topological insulating layer is a channel layer, and is a bismuth selenide ($Bi_2Se_3$) layer or a bismuth telluride ($Bi_2Te_3$) layer.

3. The device of claim 1, wherein the waveguide is a surface plasmon polariton (SPP) waveguide.

4. The device of claim 1, wherein a cross-section of the waveguide has one of a circular shape, a non-circular shape, a rectangular shape, and a trapezoidal shape.

5. The device of claim 1, wherein the elongated body of the waveguide extends between the first edge and the second edge of the waveguide in parallel to a surface of the topological insulating layer.

6. The device of claim 1, wherein the waveguide comprises a plurality of waveguide portions separated from each other.

7. The device of claim 6, wherein the plurality of waveguide portions have different sizes.

8. A method of detecting a surface plasmon and polarization using the device of claim 1, the method comprising:
generating carriers in the topological insulating layer; and
measuring the generated carriers.

9. The method of claim 8, wherein the light is one of a continuous wave of a laser, a Gaussian-type wave, a square wave, and an arbitrary wave.

10. The method of claim 8, wherein the generating the carriers in the topological insulating layer comprises irradiating light to the waveguide.

11. The method of claim 10, wherein the light has a wavelength of 1 mm or less.

12. The method of claim 10, wherein the light is one of a continuous wave of a laser, a Gaussian-type wave, a square wave, and an arbitrary wave.

13. The method of claim 8, further comprising determining a flow direction of the generated carriers.

14. The method of claim 13, wherein the generating the carriers in the topological insulating layer comprises irradiating circularly polarized light to the waveguide.

15. The method of claim 14, wherein the light has a wavelength of 1 mm or less.

16. A method of manufacturing a device for detecting a surface plasmon and polarization, the method comprising:
forming a topological insulating layer having a first edge and a second edge, on a substrate; and
forming first and second electrodes and a waveguide that are separated from each other on the topological insulating layer,
wherein the waveguide has an elongated body extending between a first edge and a second edge of the waveguide, the waveguide including:
a first portion which is connected to the topological insulating layer between the first and second electrodes and includes the first edge of the waveguide that is terminated on the topological insulating layer between the first edge and the second edge of the topological insulating layer, and
a second portion which extends from the second edge of the topological insulating layer and includes the second edge of the waveguide that is disposed opposing the first edge of the waveguide, in a lengthwise direction of the elongated body of the waveguide.

17. The method of claim 16, wherein the topological insulating layer is a bismuth selenide ($Bi_2Se_3$) layer or a bismuth telluride ($Bi_2Te_3$) layer.

18. The method of claim 16, wherein the forming the first and second electrodes and the waveguide comprises simultaneously forming the first and second electrodes and the waveguide.

19. The method of claim 16, wherein the forming the first and second electrodes and the waveguide comprises forming the first and second electrodes before or after forming the waveguide.

20. The method of claim 16, wherein the forming the waveguide comprises forming the second portion of the waveguide separately from the topological insulating layer.

21. The method of claim 16, wherein the forming the waveguide comprises forming a plurality of waveguide portions separated from each other on the topological insulating layer.

22. The method of claim 21, wherein the plurality of waveguide portions have different sizes from each other.

* * * * *